United States Patent
Sasaki

(10) Patent No.: US 10,062,870 B2
(45) Date of Patent: Aug. 28, 2018

(54) DISPLAY DEVICE INCLUDING A DIFFRACTION GRATING

(71) Applicant: Japan Display Inc., Minato-ku (JP)

(72) Inventor: Tohru Sasaki, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/353,180

(22) Filed: Nov. 16, 2016

(65) Prior Publication Data

US 2017/0250376 A1    Aug. 31, 2017

(30) Foreign Application Priority Data

Feb. 25, 2016    (JP) .................................. 2016-034469

(51) Int. Cl.
| | |
|---|---|
| *H01L 51/00* | (2006.01) |
| *H01L 29/08* | (2006.01) |
| *H01L 51/52* | (2006.01) |
| *H01L 27/32* | (2006.01) |
| *H01L 51/50* | (2006.01) |

(52) U.S. Cl.
CPC ...... *H01L 51/5281* (2013.01); *H01L 27/3211* (2013.01); *H01L 27/3244* (2013.01); *H01L 51/5012* (2013.01); *H01L 51/5206* (2013.01); *H01L 51/5221* (2013.01); *H01L 51/5253* (2013.01); *H01L 51/5262* (2013.01); *H01L 51/5265* (2013.01); *H01L 51/5268* (2013.01); *H01L 51/5275* (2013.01)

(58) Field of Classification Search
CPC ............. H01L 51/5281; H01L 51/5265; H01L 51/5268; H01L 561/5275; H01L 51/5262

USPC .............................. 257/40, E33.067, E33.068
See application file for complete search history.

(56) References Cited

U.S. PATENT DOCUMENTS

| | | | |
|---|---|---|---|
| 2005/0196528 A1 | 9/2005 | Akiyoshi | |
| 2011/0241051 A1 | 10/2011 | Carter et al. | |
| 2012/0286258 A1* | 11/2012 | Naraoka | ................ C09K 11/06 |
| | | | 257/40 |

(Continued)

FOREIGN PATENT DOCUMENTS

| | | |
|---|---|---|
| JP | 2002-158095 | 5/2002 |
| JP | 2005-284276 | 10/2005 |
| JP | 2008-091069 A | 4/2008 |

(Continued)

*Primary Examiner* — Robert Huber
(74) *Attorney, Agent, or Firm* — Oblon, McClelland, Maier & Neustadt, L.L.P.

(57) ABSTRACT

A display device has layers that are laminated. The layers includes: a display layer that has a display surface for displaying an image composed of unit pixels; a pixel electrode layer arranged to correspond to each of unit pixels; a light emitting element layer laminated on the pixel electrode layer and arranged to emit light with its luminance controlled by a current; a common electrode layer provided so as to be laminated on the light emitting element layer; and a sealing layer that seals a light emitting element. The layers include at least two layers for holding the light emitting element layer therebetween and having a microcavity structure. Diffraction gratings are formed on an interface between a first grating layer and a first organic layer and on an interface between a second grating layer and a second organic layer respectively, and consequently a viewing angle is widened.

13 Claims, 9 Drawing Sheets

(56) References Cited

U.S. PATENT DOCUMENTS

2013/0107132 A1* 5/2013 Tominaga .............. G02B 5/008
  348/744
2014/0175404 A1* 6/2014 Shim ................... H01L 51/5275
  257/40

FOREIGN PATENT DOCUMENTS

| JP | 2009-272059 | 11/2009 |
| JP | 2012-507110 | 3/2012 |
| KR | 10-2003-0029467 A | 4/2003 |
| KR | 10-2014-0137954 A | 12/2014 |
| KR | 1020140137954 A1 * | 12/2014 |

\* cited by examiner

DISPLAY DEVICE INCLUDING A DIFFRACTION GRATING

CROSS-REFERENCE TO RELATED APPLICATION

The present application claims priority from Japanese application JP2016-034469 filed on Feb. 25, 2016, the content of which is hereby incorporated by reference into this application.

BACKGROUND OF THE INVENTION

1. Field of the Invention

The present invention relates to a display device.

2. Description of the Related Art

In recent years, along with an improvement of the information technology, needs for a thin display device are getting larger. For example, a thin display device such as a liquid crystal display device, a plasma display, and an organic EL display device has been put into practical use. Also, research and development for higher luminance and higher resolution of each type of thin display devices is actively performed. For example, as one of methods for enhancing luminance of an organic EL (Electro Luminescence) display device, a method to adopt a microcavity structure for an organic EL display device with a light emitting element structure of a top surface light emitting type has been proposed.

On an organic electroluminescence panel of a side-by-side method where a color of emitted light differs at each subpixel, when a microcavity effect is strengthened to enhance color purity of each color of RGB, a wavelength of light emitted from a light emitting layer changes according to a viewing angle and a chromaticity is shifted, which deteriorates a display quality. In other words, the viewing angle is narrowed down. Each of JP2005-284276A, JP2002-158095A, JP2009-272059A and JP2012-507110A discloses improving light extracting efficiency using a diffraction grating, but does not disclose widening the viewing angle.

SUMMARY OF THE INVENTION

An object of the present invention is to widen the viewing angle that is narrowed down by the microcavity effect.

A display device according to the present invention is a display device that includes a plurality of layers that are laminated, the plurality of layers including: a display layer that includes a display surface; a pixel electrode layer provided with a pixel electrode that corresponds to each of a plurality of unit pixels; a light emitting element layer laminated on the pixel electrode layer; a common electrode layer laminated on the light emitting element layer; and a sealing layer laminated on the common electrode layer, wherein the plurality of layers include at least two layers that hold the light emitting element layer therebetween and have a microcavity structure, and include at least one pair of layers laminated each other are located between the light emitting element layer and the display layer, and an interface of the at least one pair of layers constitutes at least one diffraction grating.

In the present invention, light that travels straight with a microcavity is made to travel in an oblique direction by a diffraction grating, and thus it is possible to enlarge the viewing angle.

DETAILED DESCRIPTION OF THE INVENTION

Below, embodiments to which the present invention is applied are explained with reference to the accompanying drawings.

First Embodiment

Figure 1:
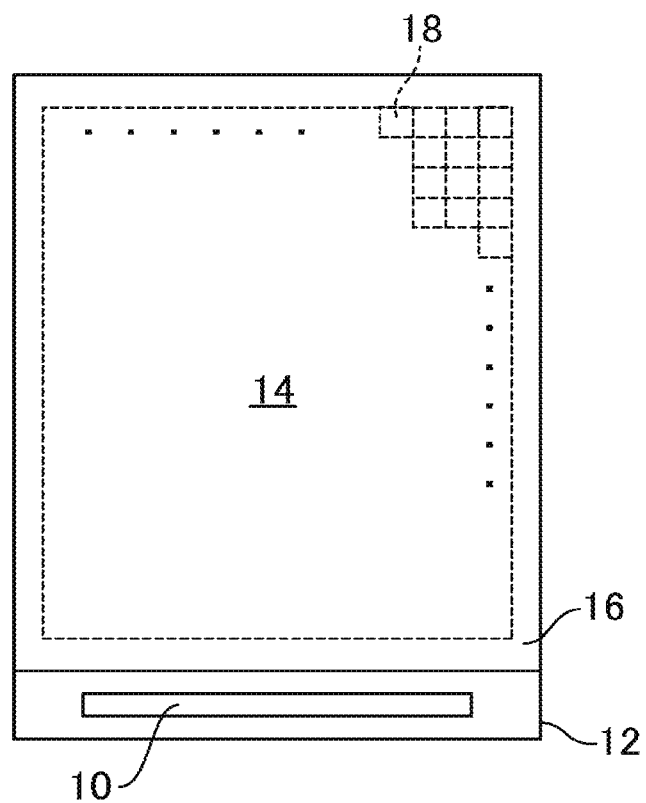
FIG. 1 is a schematic view illustrating a display device according to a first embodiment of the present invention.

FIG. 1 is a schematic view illustrating a display device according to the first embodiment of the present invention. As the display device, an organic electroluminescence display device is mentioned as an example. The display device has a circuit substrate 12 on which a driving IC (Integrated Circuit) 10 is loaded. On the circuit substrate 12, a display layer 16 that has a display surface 14 is laminated. On the display surface 14, an image composed of a plurality of unit pixels 18 composed of light is displayed.

Figure 2:
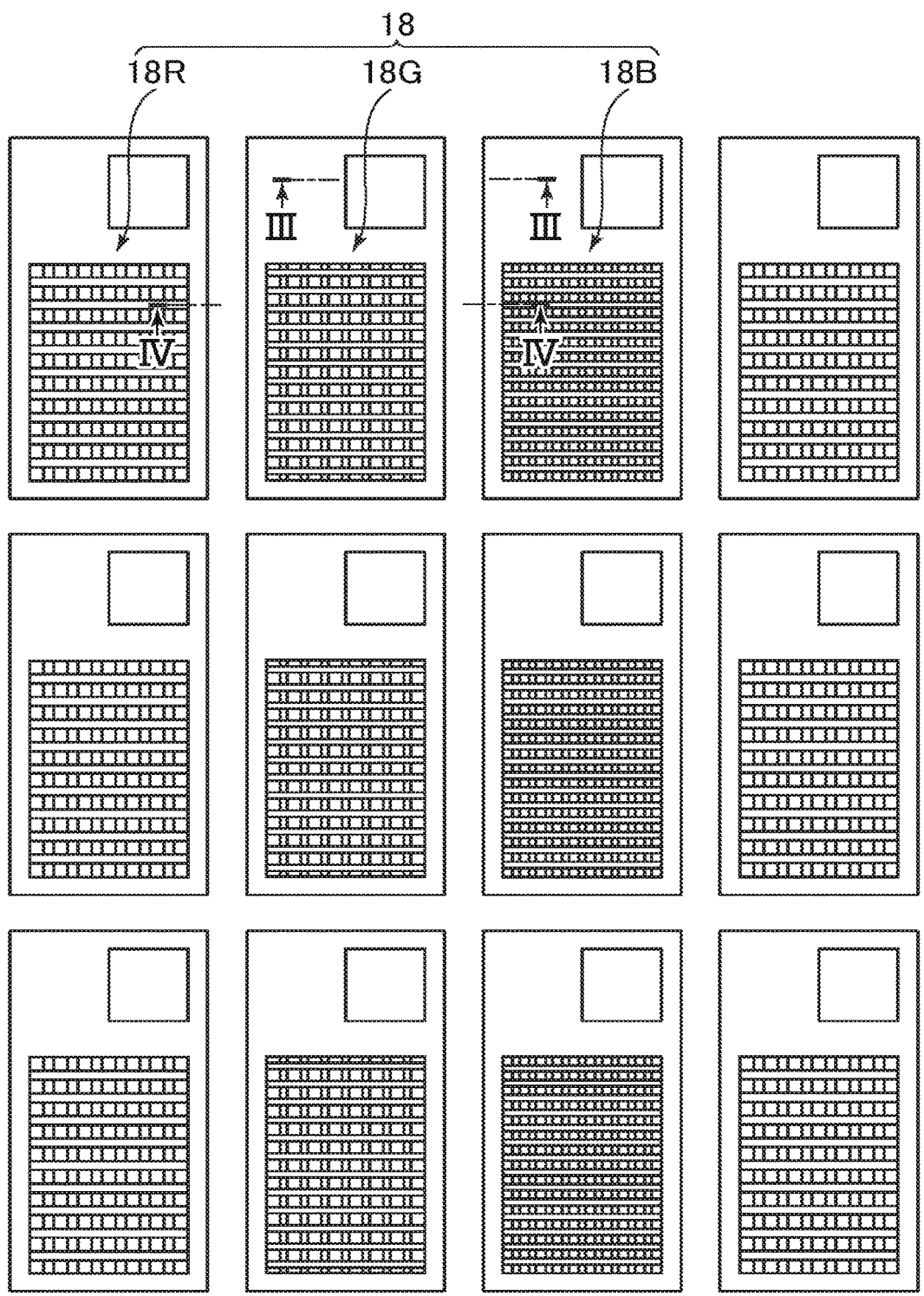
FIG. 2 is a magnified view of a display device illustrating a plurality of unit pixels in enlarged forms.
Figure 3:
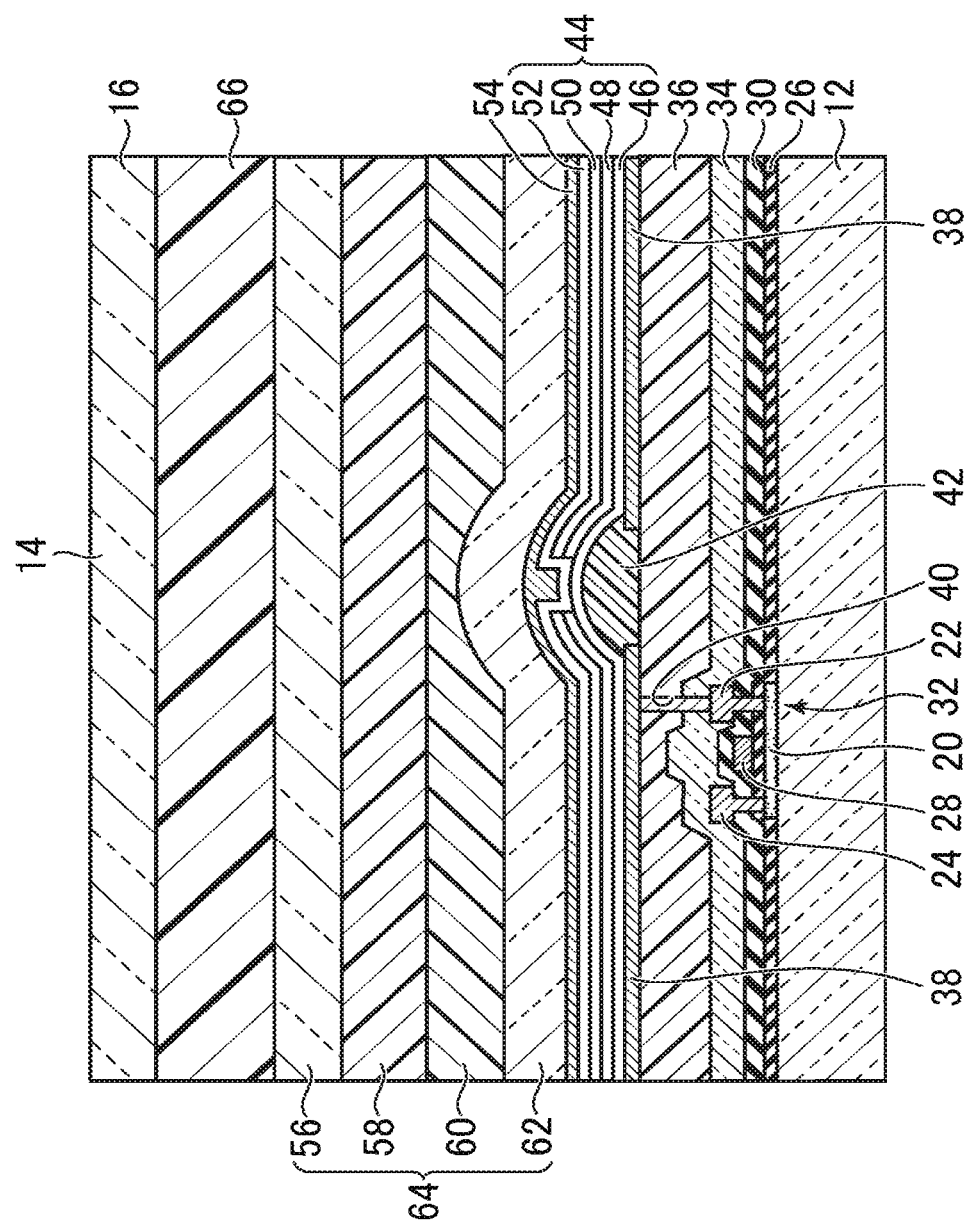
FIG. 3 is a sectional view of line of the display device illustrated in FIG. 2.
Figure 4:
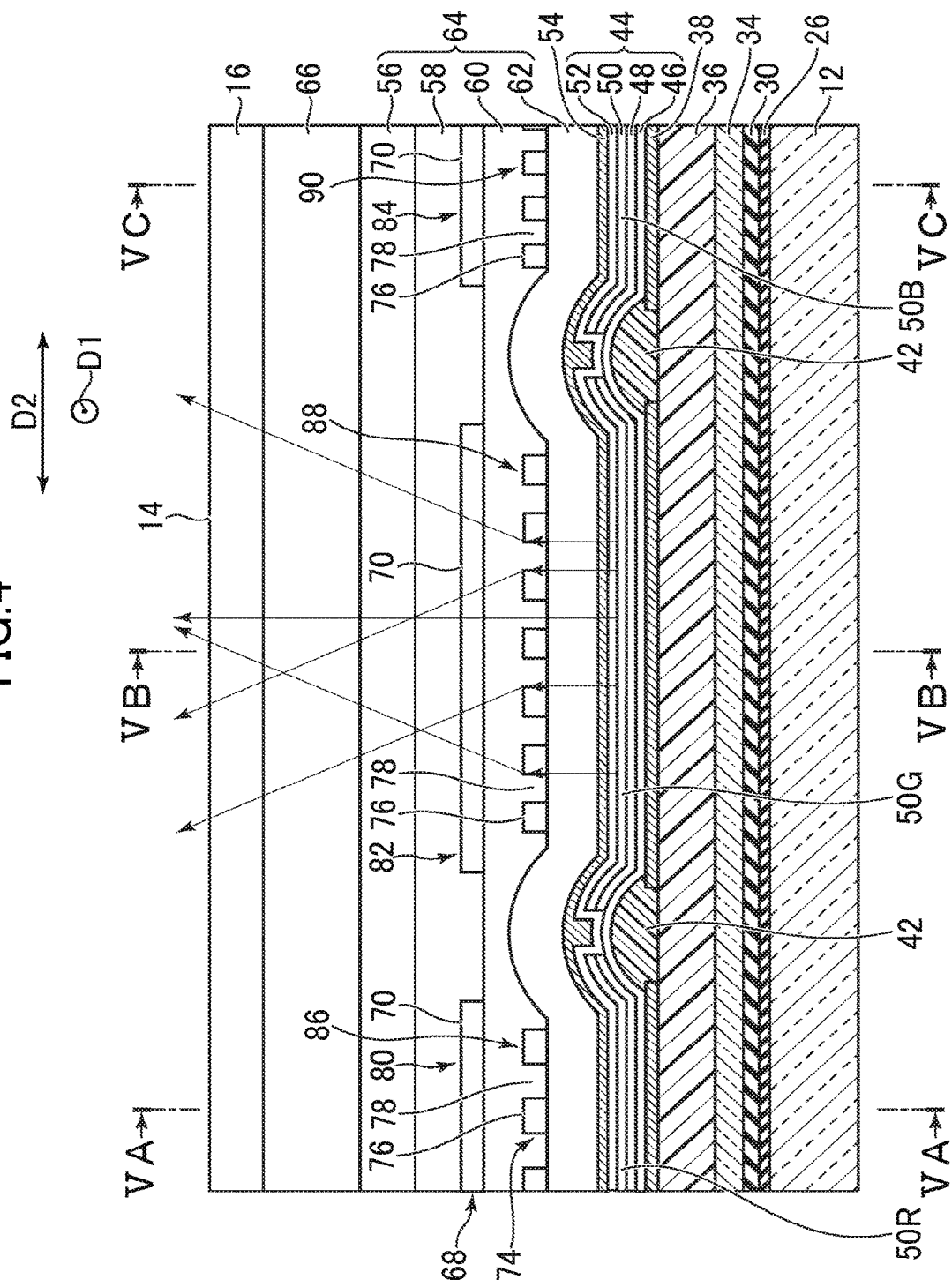
FIG. 4 is a sectional view of IV-IV line of the display device illustrated in FIG. 2.

FIG. 2 is a magnified view of a display device illustrating a plurality of unit pixels 18 in enlarged forms. FIG. 3 is a sectional view of line of the display device illustrated in FIG. 2. FIG. 4 is a sectional view of IV-IV line of the display device illustrated in FIG. 2.

The display device according to this embodiment displays a full color image. The plurality of unit pixels 18 includes unit pixels 18 of a plurality of colors (e.g. red, green and blue), such as a red pixel 18R, a green pixel 18G, and a blue pixel 18B, and the full color image is composed by synthesizing them. Light that composes the image include a plurality of kinds of light whose wavelengths are different to one another. Among colors of red, green and blue, the light of red has the largest wavelength, and the light of blue has the smallest wavelength.

As illustrated in FIG. 3, a semiconductor layer 20 is formed on the circuit substrate 12. A source electrode 22 and a drain electrode 24 are provided on the semiconductor layer 20. A gate insulation film 26 is formed so as to cover the semiconductor layer 20, and a gate electrode 28 is formed on the gate insulation layer 26. An interlayer insulation film 30 is formed so as to cover the gate electrode 28. The source electrode 22 and the drain electrode 24 penetrate the gate insulation film 26 and the interlayer insulation film 30. A thin film transistor 32 is composed of the semiconductor layer 20, the source electrode 22, the drain electrode 24, and the gate electrode 28. A passivation film 34 is provided so as to cover the thin film transistor 32.

On the passivation film 34, an electrode base layer is provided. On the electrode base layer 36, a pixel electrode layer 38 is provided that is arranged to correspond to each of the plurality of unit pixels 18. The electrode base layer 36 is formed such that the surface on which at least the pixel electrode layer 38 is provided becomes flat. The pixel electrode layer 38 is composed of, for example, a lower layer that reflects light and an upper layer that transmits light, and is configured to reflect light. The pixel electrode layer 38 is electrically connected to one of the source electrode 22 and the drain electrode 24 on the semiconductor layer 20 through a contact hole 40 that penetrates the electrode base layer 36 and the passivation film 34.

An insulation layer 42 is formed on the electrode base layer 36 and the pixel electrode layer 38. The insulation layer 42 is on a peripheral part of the pixel electrode layer 38, and is formed so as to open up a part (e.g. a central part) of the pixel electrode layer 38. A bank that surrounds the part of the pixel electrode layer 38 is formed by the insulation layer 42.

A light emitting element layer 44 (sometimes referred to as self-luminescent element layer) is provided on the pixel electrode layer 38. The light emitting element layer includes a hole transport injection layer 46, a hole transport layer 48, a light emitting layer 50, and an electron injection transport layer 52. The light emitting layer 50 is provided for the respective pixel electrode layers 38 separately in correspondence with the unit pixels of different colors. As illustrated in FIG. 4, a red light emitting layer 50R, a green light emitting layer 50G, and a blue light emitting layer 50B are provided in correspondence with the red pixel 18R, the green pixel 18G and the blue pixel 50B illustrated in FIG. 2. The hole transport layer 48 is provided for the respective pixel electrode layers 38 separately. Meanwhile, the hole transport injection layer 46 and the electron injection transport layer 52 are arranged over a plurality of the pixel electrode layers 38 so as to continuously cover them.

On the light emitting element layer 44, a common electrode layer 54 (e.g. a cathode) is provided. The common electrode layer 54 is formed to be arranged above the insulation layer 42 that is the bank. The light emitting element layer 44 is held between the pixel electrode layer 38 and the common electrode layer 54, and emits light by a current that runs between them with its luminance controlled by the thin film transistor 32 (FIG. 3).

The light emitting element layer 44 is sealed by a sealing layer 64 composed of a plurality of layers that are laminated (e.g. a first inorganic layer 56, a first organic layer 58, a second organic layer 60 and a second inorganic layer 62), and is shut off from moisture. The first inorganic layer 56 and the second inorganic layer 62 can be formed with an inorganic material such as silicon nitride, and the first organic layer 58 and the second organic layer 60 can be formed with an organic material such as polyimide resin and acrylic resin. As to the light refractive index, silicon nitride has the largest value, polyimide resin has the second largest value, and acrylic resin has the smallest value. Each of the plurality of layers that compose the sealing layer 64 is light transmitting. Above the sealing layer 64, the display layer 16 that is an opposing substrate made of transparent glass, resin or the like is provided with an interposition of a filler layer 66 that is light transmitting. A black matrix (not shown) may be provided for the display layer 16.

As illustrated in FIG. 4, a first grating layer 68 is provided between the first organic layer 58 and the second organic layer 60. The first grating layer 68 may be light shading, but is light transmitting in this example. The first grating layer 68 has a first surface form that has a plurality of first protrusion strip parts 70. Each of the plurality of first protrusion strip parts 70 is arranged with an interval in a first direction D1 (the back-and-front direction of the paper) that is parallel with the display surface 14 and extends in a second direction D2 (right-left direction in FIG. 4) that intersects the first direction D1. The first organic layer 58 is laminated in contact with the first surface form of the first grating layer 68. The first grating layer 68 has a plurality of first slits 72 each of which extends in the second direction D2 (see FIG. 5). Between neighboring first slits 72, each of the plurality of first protrusion strip parts 70 is formed. Note that the first direction D1 and the second direction D2 can be defined arbitrarily, and can be exchanged with each other.

A second grating layer 74 is provided between the second organic layer 60 and the second inorganic layer 62. The second grating layer 74 may be light shading, but is light transmitting in this example. The second grating layer 74 has a second surface form that has a plurality of second protrusion strip parts 76. Each of the plurality of second protrusion strip parts 76 is arranged with an interval in the second direction D2 and extends in the first direction D1. The width of the plurality the second protrusion strip parts 76 is equivalent to that of the plurality the first protrusion strip parts 70. The second organic layer 60 is laminated in contact with the second surface form of the second grating layer 74. The second grating layer 74 has a plurality of second slits 78 each of which extends in the first direction D1, and between neighboring second slits 78, each of the plurality of second protrusion strip parts 76 is formed. The width of the second slit 78 is equivalent to that of the first slit 72.

The display device has a plurality of layers that are laminated. At least two layers (the pixel electrode layer and the common electrode layer 54, specifically) hold the light emitting element layer 44 between them and compose a microcavity. Due to the microcavity, a resonance of light occurs and strong light with high color purity can be extracted. One of the pixel electrode layer 38 and the common electrode layer 54 (the pixel electrode layer 38, specifically) is a reflection layer of the light emitting element layer 44 located on the opposite side from the display layer 16, and is one of the at least two layers to compose the microcavity.

The light resonates vertically in the microcavity, and therefore the viewing angle dependency is high. Thus, an intensity of a light emission to an oblique direction is small compared with that to a front direction. Accordingly, in this embodiment, the viewing angle is configured to be widened by a diffraction of the light. Specifically, the diffraction grating is provided in the middle of the path of the light that goes from the light emitting element layer 44 to the display layer 16.

A first diffraction grating is formed on an interface of at least one pair of layers (a first layer and a second layer). The first layer is the first grating layer 68 and the second layer is the first organic layer 58. On the surface of the first grating layer 68, the first diffraction grating is formed. Since the first slit 72 extends in the second direction D2, the light is diffracted in the first direction D1. The first diffraction grating is a transmitting type diffraction grating, and is on the side where the display layer 16 exists when seen from the light emitting element layer 44. In the case where the first diffraction grating layer 68 is light transmitting, the light that has transmitted the first grating layer 68 itself can be utilized as a part of the unit pixel 18. Note that the first grating layer 68 that is light transmitting is formed with a material whose light refractive index is larger than that of the second layer (the first organic layer 58).

Another pair of layers (a third layer and a fourth layer) are laminated also in a form where the interface constitutes a diffraction grating. The third layer is the second grating layer 74 and the fourth layer is the second organic layer 60. On the surface of the second grating layer 74, the second diffraction grating is formed. Since the second slit 78 extends in the first direction D1, the light is diffracted in the second direction D2. The second diffraction grating is a transmitting type diffraction grating, and is on the side where the display layer 16 exists when seen from the light emitting element layer 44. In the case where the second diffraction grating layer 74 is light transmitting, the light that has transmitted the second grating layer 74 itself can be utilized as a part of the unit pixel 18. Note that the second grating layer 74 that is light transmitting is formed with a material whose light refractive index is larger than that of the fourth layer (the second organic layer 60).

Figure 5:
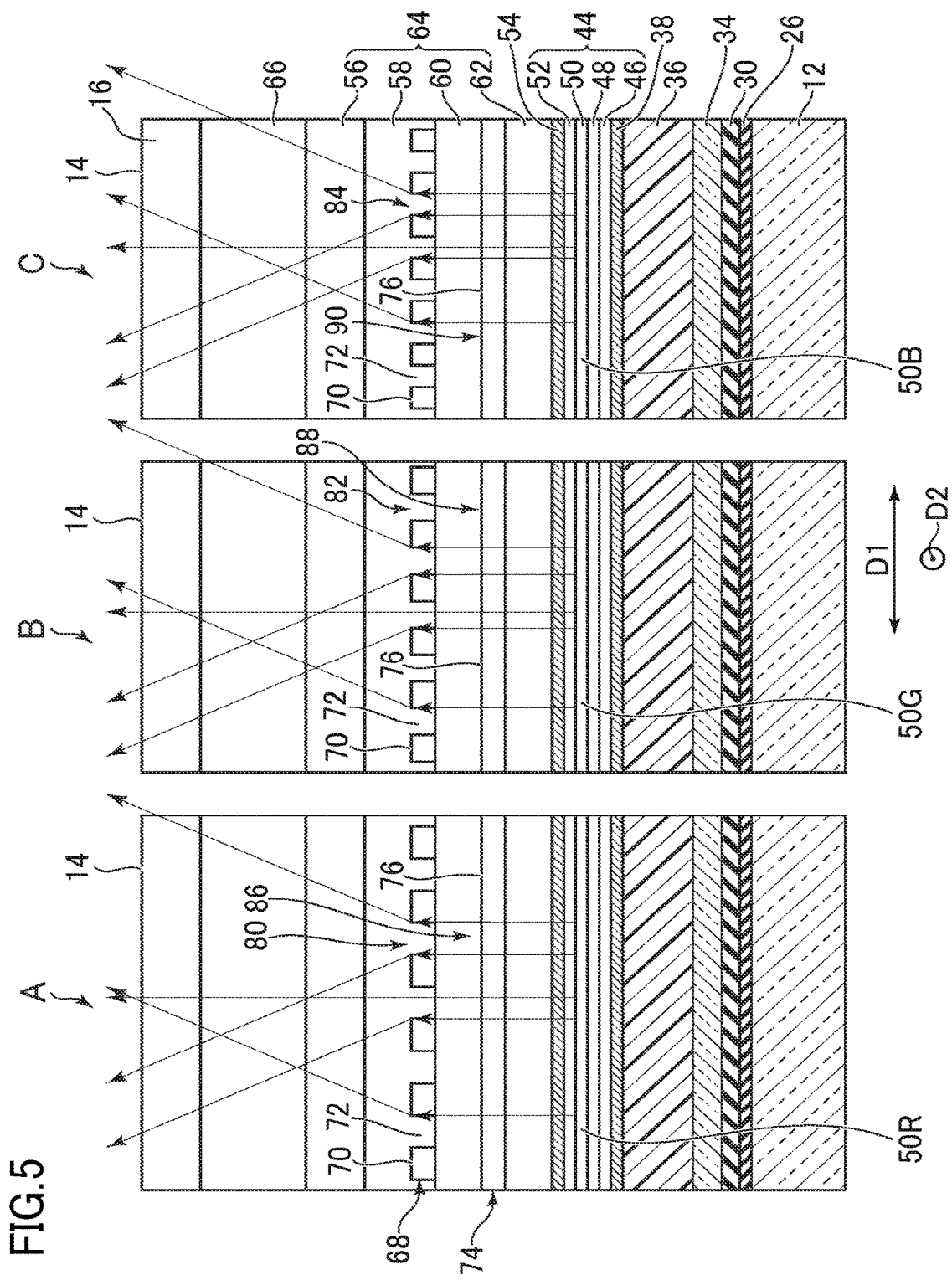
FIG. 5 is a sectional view where parts A, B and C are arranged side by side to illustrate respective cross sectional views of VA-VA line, VB-VB line, and VC-VC line of the display device illustrated in FIG. 4.

FIG. 5 is a sectional view where parts A, B and C are arranged side by side to illustrate respective cross sectional views of VA-VA line, VB-VB line, and VC-VC line of the display device illustrated in FIG. 4.

Regarding a diffraction grating, the diffraction angle gets larger as a wavelength of light gets larger, and the diffraction angle gets smaller as a width of a slit gets larger. The first diffraction grating includes a plurality of kinds of the first diffraction grating that respectively correspond to a plurality of kinds of light. Specifically, the plurality of kinds of the first diffraction grating changes a mutual interval of the plurality of first protrusion strip parts 70 (i.e. a width of the first slit 72) depending on a wavelength of a corresponding one of the various kinds of light. More specifically, a first red diffraction grating 80 that corresponds to red light, a first green diffraction grating that corresponds to green light, and a first blue diffraction grating 84 that corresponds to blue light are provided. The first slit 72 of the first red diffraction grating 80 has the largest width, the first slit 72 of the first green diffraction grating 82 has the second largest width, and the first slit 72 of the first blue diffraction grating 84 has the smallest width. For example, their ratio is 6:5:4. Consequently, directions in which a plurality of kinds of light with different colors travel can be uniformed by a diffraction.

Similarly, the second diffraction grating includes a plurality of kinds of the second diffraction grating that respectively correspond to a plurality of kinds of light. Specifically, the plurality of kinds of the second diffraction grating changes a mutual interval of the plurality of the second protrusion strip parts 76 (i.e. a width of the second slit 78) depending on a wavelength of a corresponding one of the various kinds of light. More specifically, a second red diffraction grating 86 that corresponds to red light, a second green diffraction grating 88 that corresponds to green light, and a second blue diffraction grating 90 that corresponds to blue light are provided. The second slit 78 of the second red diffraction grating 86 has the largest width, the second slit 78 of the second green diffraction grating 88 has the second largest width, and the second slit 78 of the second blue diffraction grating 90 has the smallest width. For example, their ratio is 6:5:4. Consequently, directions in which a plurality of kinds of light with different colors travel can be uniformed by a diffraction.

In this embodiment, light that travels straight with a microcavity is made to travel in an oblique direction by a diffraction grating, and thus it is possible to widen the viewing angle. Opening widths (widths of slits) of the first blue diffraction grating 84 and the second blue diffraction grating 90 are equal to each other, opening widths (widths of slits) of the first red diffraction grating 80 and the second red diffraction grating 86 are equal to each other, and opening widths (widths of slits) of the first green diffraction grating 82 and the second green diffraction grating 88 are equal to each other. Consequently, diffraction angles of light traveling in the first direction D1 and diffraction angles of light traveling in the second direction D2 can be made equal to one another.

Second Embodiment

Figure 6:
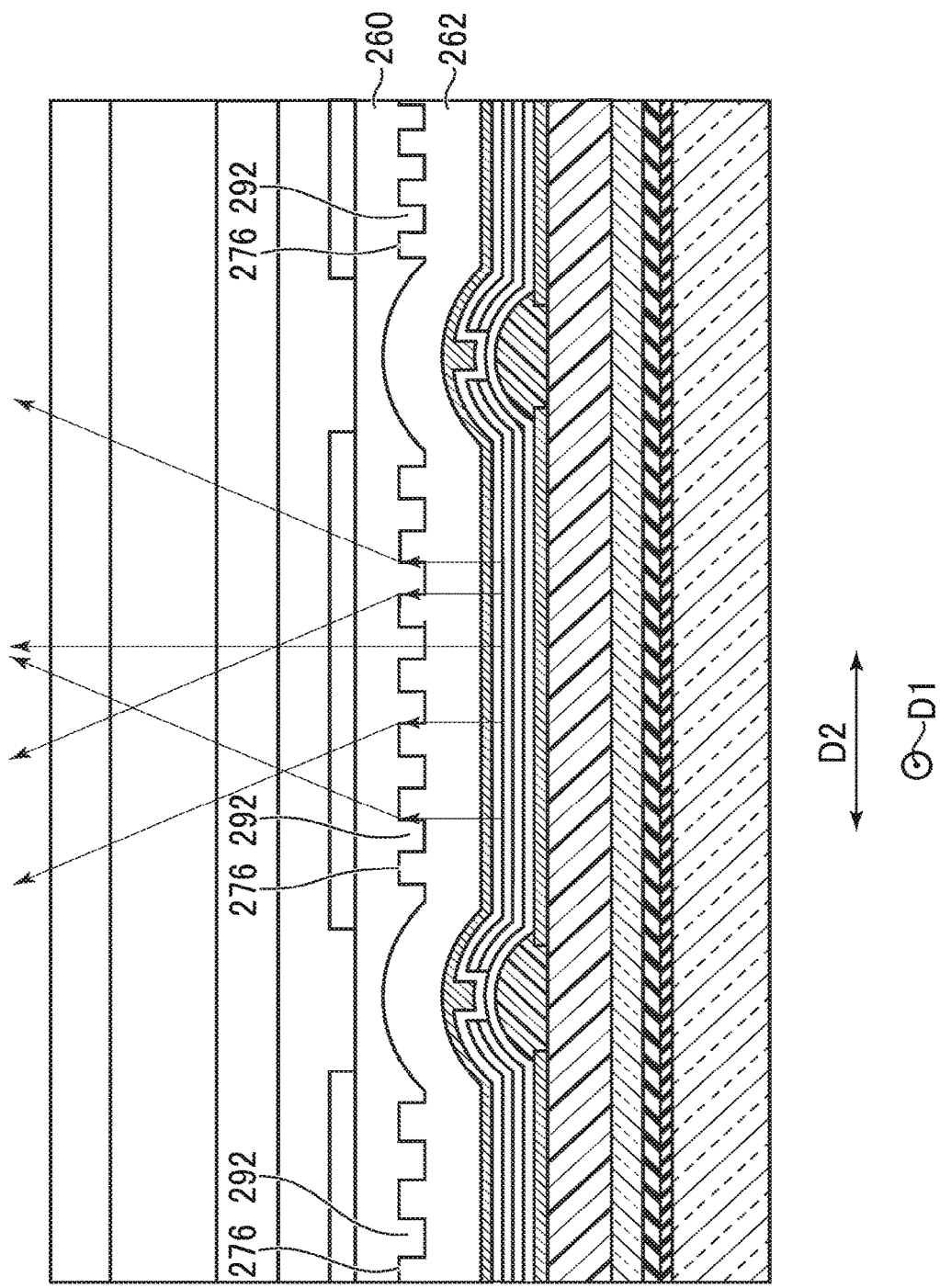
FIG. 6 is a schematic sectional view illustrating a display device according to a second embodiment of the present invention.

FIG. 6 is a schematic sectional view illustrating a display device according to a second embodiment of the present invention. In this embodiment, the third and fourth layers for constituting the second diffraction grating differ from those of the first embodiment. Specifically, a second inorganic layer 262 is the third layer, and a second organic layer 260 is the fourth layer. The third layer (the second inorganic layer 262) is made of a material which has a light refraction index larger than that of the fourth layer (the second organic layer 260). The second inorganic layer 262 (the third layer) has a plurality of second recession strip parts 292 each of which extends in the first direction D1. Between neighboring second recession strip parts 292, each of a plurality of second protrusion strip parts 276 is formed. The contents of the explanation of the first embodiment can be applied to the other parts.

Third Embodiment

Figure 7:
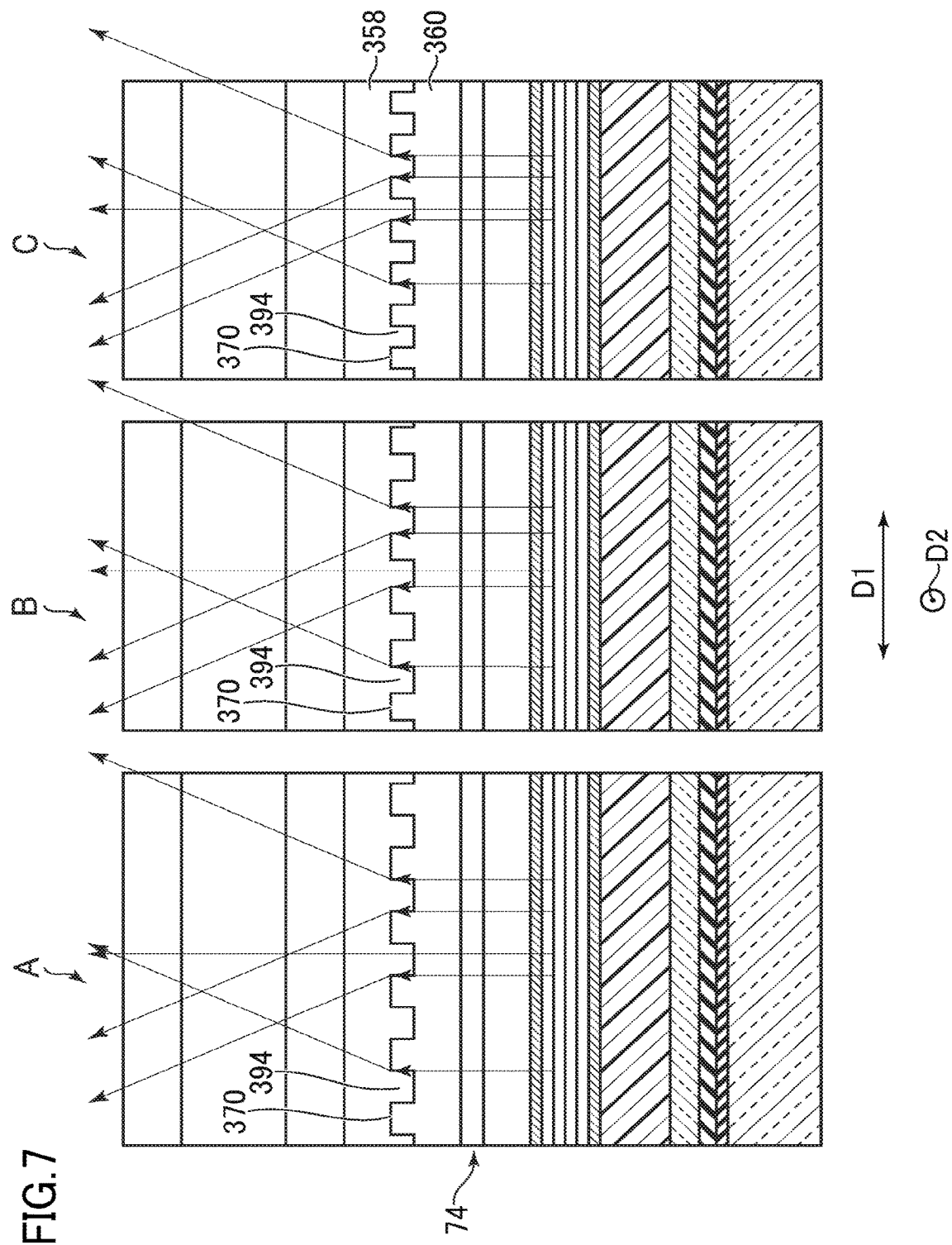
FIG. 7 is a sectional view of a display device according to a third embodiment of the present invention, where parts A, B and C are arranged side by side to illustrate respective cross sectional views of the same positions as those illustrated in A, B and C of FIG. 5.

FIG. 7 is a sectional view of a display device according to a third embodiment of the present invention, where parts A, B and C are arranged side by side to illustrate respective cross sectional views of the same positions as those illustrated in A, B and C of FIG. 5.

In this embodiment, the first layer to constitute the first diffraction grating differs from that of the first embodiment. Specifically, a second organic layer 360 is the first layer, and a first organic layer 358 is the second layer. The second organic layer 360 (the first layer) has a plurality of first recession strip parts 394 each of which extends in the second direction D2, and between neighboring first recession strip parts 394, each of a plurality of first protrusion strip parts 370 is formed. The contents of the explanation of the first embodiment can be applied to the other parts.

Fourth Embodiment

Figure 8:
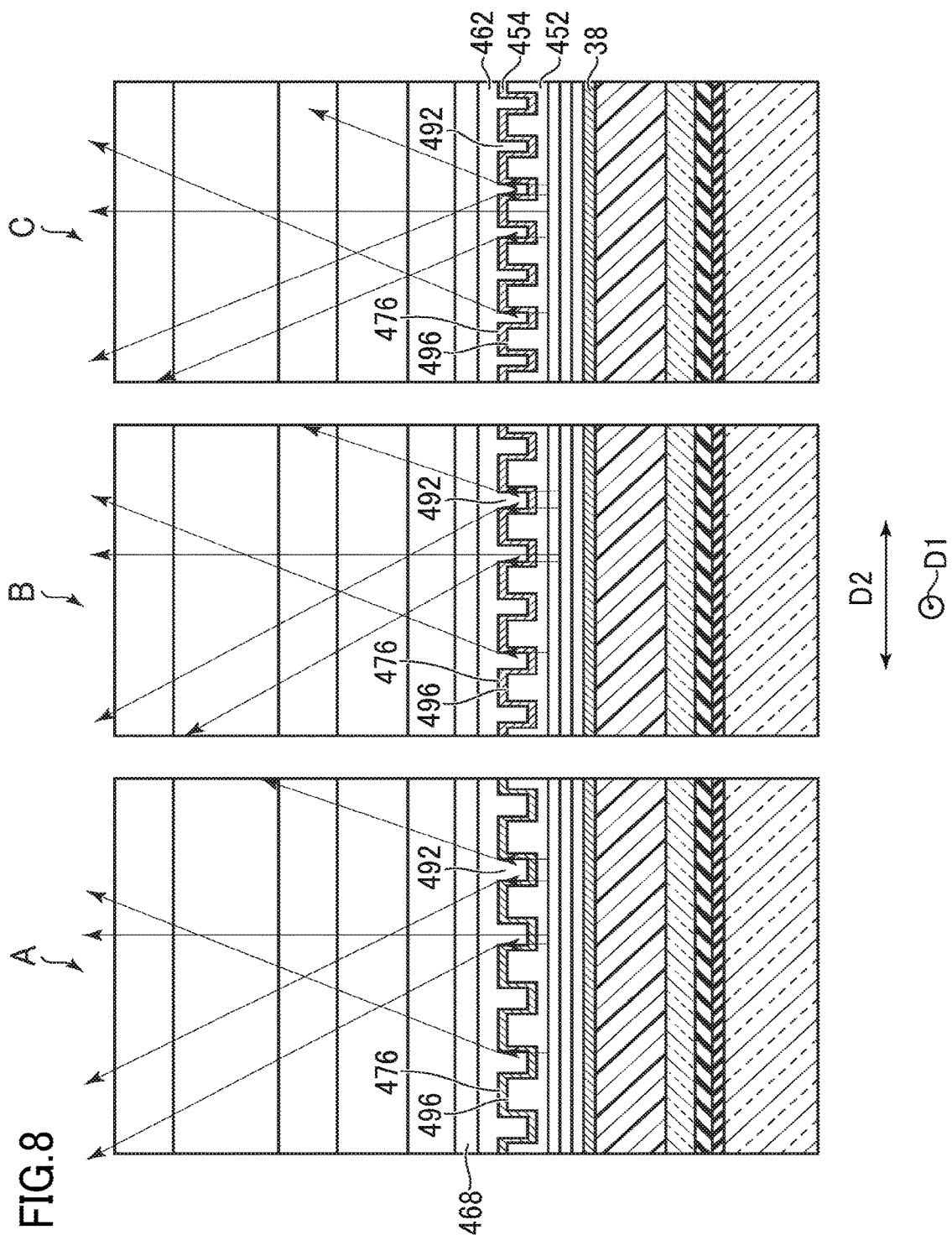
FIG. 8 is a sectional view of a display device according to a fourth embodiment of the present invention, where parts A, B and C are arranged side by side to illustrate respective views of cross sections that perpendicularly intersect the cross sections illustrated in A, B and C of FIG. 5.

FIG. 8 is a sectional view of a display device according to a fourth embodiment of the present invention, where parts A, B and C are arranged side by side to illustrate respective views of cross sections that perpendicularly intersect the cross sections illustrated in A, B and C of FIG. 5. Therefore, in FIGS. 5 and 8 the first direction D1 and the second direction D2 are replaced with each other.

In this embodiment, the first diffraction grating is in a structure that has been described as the second diffraction grating in the first embodiment. In other words, a first grating layer 468 that extends in the second direction D2 has the same structure as the second grating layer 74 illustrated in FIG. 5 except for the direction.

The third and fourth layers for constituting the second diffraction grating of this embodiment differ from those of the first embodiment. Specifically, one of the pixel electrode layer 38 and a common electrode layer 454 is separated from the display layer 16 by a first distance, and the other one of the pixel electrode layer 38 and the common electrode layer 454 is separated from the display layer 16 by a second distance. The first distance from the display layer 16 is less than the second distance from the display layer 16, and the one of the pixel electrode layer 38 and the common electrode layer 454 that is separated from the display layer 16 by the first distance (the common electrode layer 454) is the third layer. A second inorganic layer 462 is the fourth layer. Note that the third layer (the common electrode layer 454) is made of a material that has a light refraction index larger than that of the fourth layer (the second inorganic layer 462). The common electrode layer 454 (the third layer) has a plurality of second recession strip parts 492 each of which extends in the first direction D1. Between neighboring second recession strip parts 492 each of a plurality of second protrusion strip parts 476 is formed.

The second surface form that the common electrode layer 454 (the third layer) has corresponds to a form of an electron injection transport layer 452 disposed thereunder. On the surface of the electron injection transport layer 452 as well, a plurality of protrusion strip parts 496 each of which extends in the first direction D1 are formed. The contents of the explanation of the first embodiment can be applied to the other parts.

Fifth Embodiment

Figure 9:
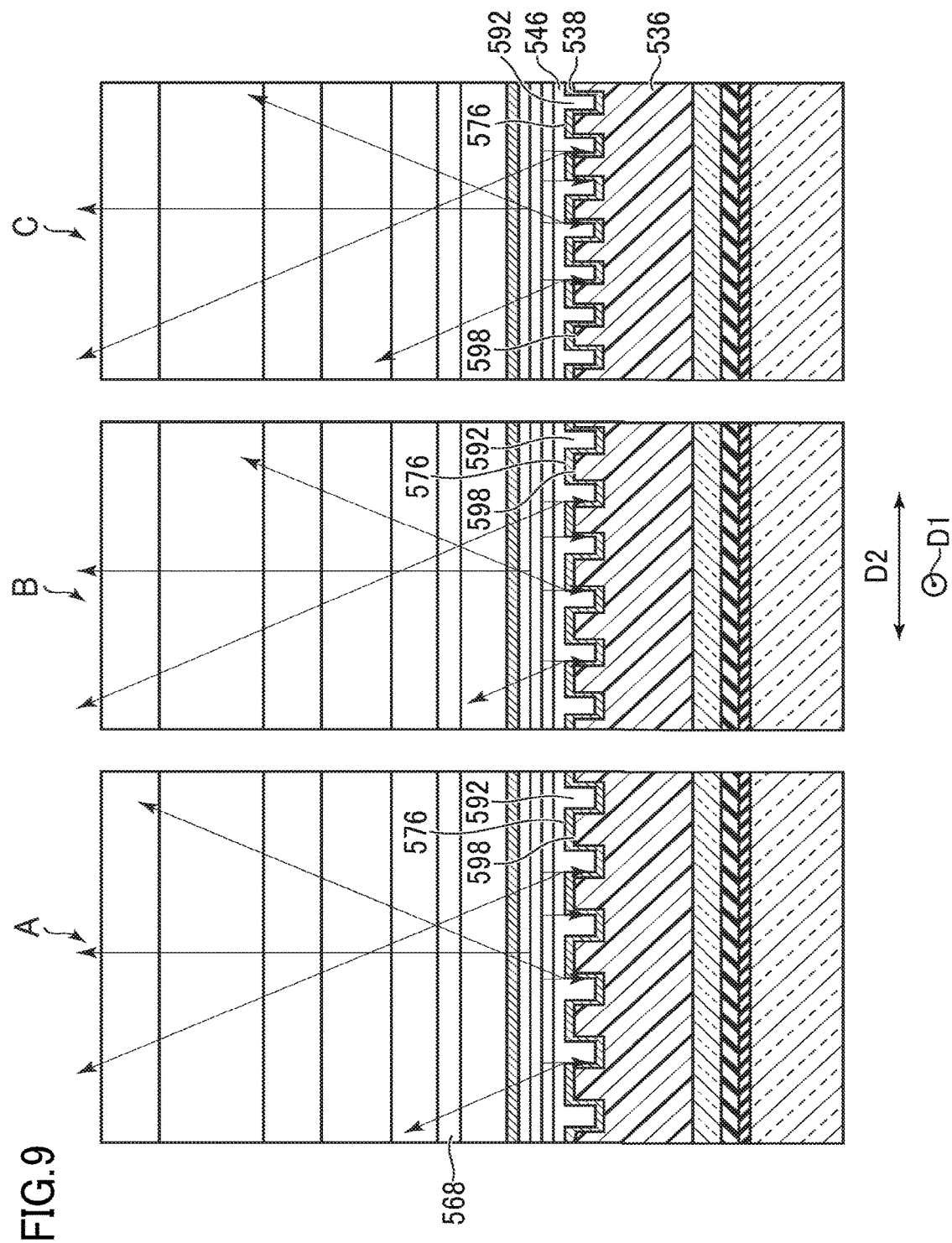
FIG. 9 is a sectional view of a display device according to a fifth embodiment of the present invention, where parts A, B and C are arranged side by side to illustrate respective views of cross sections that perpendicularly intersect the cross sections illustrated in A, B and C of FIG. 5.

FIG. 9 is a sectional view of a display device according to a fifth embodiment of the present invention, where parts A, B and C are arranged side by side to illustrate respective views of cross sections that perpendicularly intersect the cross sections illustrated in A, B and C of FIG. 5. Therefore, in FIGS. 5 and 9 the first direction D1 and the second direction D2 are replaced with each other.

In this embodiment, the first diffraction grating is in a structure that has been described as the second diffraction grating in the first embodiment. In other words, the first grating layer 568 that extends in the second direction D2 has the same structure as the second grating layer 74 illustrated in FIG. 5 except for the direction.

The third and fourth layers for constituting the second diffraction grating of this embodiment differ from those of the first embodiment. The second diffraction grating is a reflecting type diffraction grating. Specifically, one of the pixel electrode layer 538 and a hole transport injection layer 546 is separated from the display layer 16 by a first distance, and the other one of the pixel electrode layer 538 and the hole transport injection layer 546 is separated from the display layer 16 by a second distance. The first distance from the display layer 16 is less than the second distance from the display layer 16, and the other one of the pixel electrode layer 538 and the hole transport injection layer 546 that is separated from the display layer 16 by the second distance (the pixel electrode layer 538) is the third layer. The hole transport injection layer 546 is the fourth layer. Note that the third layer (the pixel electrode layer 538) is made of a material that has a light refraction index larger than that of the fourth layer (the hole transport injection layer 546). The pixel electrode layer 538 (the third layer) has a plurality of second recession strip parts 592 each of which extends in the first direction D1. Between neighboring second recession strip parts 592 each of a plurality of second protrusion strip parts 576 is formed.

The second surface form that the pixel electrode layer 538 (the third layer) has corresponds to a form of an electrode base layer 536 disposed thereunder. On the surface of the electrode base layer 536 as well, a plurality of protrusion strip parts 598 each of which extends in the first direction D1 are formed. The contents of the explanation of the first embodiment can be applied to the other parts.

Note that the display device is not limited to an organic electroluminescence display device, and can be a display device that is provided with a light emitting element such as a quantum dot light emitting diode (QLED) for each pixel.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A display device that includes a plurality of layers that are laminated, the plurality of layers comprising:
   a display layer that includes a display surface;
   a pixel electrode layer provided with a pixel electrode that corresponds to each of a plurality of unit pixels;
   a light emitting element layer laminated on the pixel electrode layer;
   a common electrode layer laminated on the light emitting element layer; and
   a sealing layer laminated on the common electrode layer, wherein
   the plurality of layers include at least two layers that hold the light emitting element layer therebetween and have a microcavity structure, and include at least one pair of layers laminated to each other and are located between the light emitting element layer and the display layer,
   an interface of the at least one pair of layers constitutes at least one diffraction grating,
   the at least one pair of layers for constituting the at least one diffraction grating comprises a first layer with a surface form that includes a first plurality of protrusion strip parts arranged with a plurality of intervals having different widths in a first direction that is parallel with the display surface, the first plurality of protrusion strip parts extending in a second direction that intersects the first direction, and a second layer that is laminated in contact with the surface form,
   the at least one diffraction grating is formed on a surface of the first layer,
   the at least one pair of layers for constituting the at least one diffraction grating comprises a third layer with a second surface form that includes a second plurality of protrusion strip parts each of which is arranged with an interval in the second direction and extends in the first direction, and a fourth layer that is laminated in contact with the second surface form, and
   the at least one diffraction grating is formed also on a surface of the third layer.

2. The display device according to claim 1, wherein one of the pixel electrode layer and the common electrode layer comprises a reflection layer, and is one of the at least two layers for constituting the microcavity.

3. The display device according to claim 1, wherein the first layer includes a plurality of slits each of which extends in the second direction and between neighboring ones of the slits each of the first plurality of protrusion strip parts is formed.

4. The display device according to claim 1, wherein the first layer includes a plurality of recession strip parts each of which extends in the second direction and between neighboring ones of the recession strip parts each of the first plurality of protrusion strip parts is formed.

5. The display device according to claim 1, wherein the at least one diffraction grating formed on the surface of the first layer is a transmitting type diffraction grating and is arranged on a side where the display layer exists when seen from the light emitting element layer.

6. The display device according to claim 1, wherein the third layer includes a plurality of second slits each of which extends in the first direction and between neighboring ones of the second slits each of the second plurality of protrusion strip parts is formed.

7. The display device according to claim 1, wherein the third layer includes a plurality of second recession strip parts each of which extends in the first direction and between neighboring ones of the second recession strip parts each of the second plurality of protrusion strip parts is formed.

8. The display device according to claim 1, wherein the at least one diffraction grating formed on the surface of the third layer is a transmitting type diffraction grating and is arranged on a side where the display layer exists when seen from the light emitting element layer.

9. The display device according to claim 8, wherein one of the pixel electrode layer and the common electrode layer is separated from the display layer by a first distance,
the other one of the pixel electrode layer and the common electrode layer is separated from the display layer by a second distance, wherein the first distance from the display layer is less than the second distance from the display layer, and
one of the third layer and the fourth layer is the one of the pixel electrode layer and the common electrode layer.

10. The display device according to claim 1, wherein the at least one diffraction grating formed on the surface of the third layer is a reflecting type diffraction grating and is arranged on a side opposite to a side where the display layer exists when seen from the light emitting element layer.

11. The display device according to claim 10, wherein one of the pixel electrode layer and the common electrode layer is separated from the display layer by a first distance,
the other one of the pixel electrode layer and the common electrode layer is separated from the display layer by a second distance, wherein the first distance from the display layer is less than the second distance from the display layer, and
one of the third layer and the fourth layer is the other one of the pixel electrode layer and the common electrode layer.

12. The display device according to claim 1, wherein the plurality of unit pixels are composed of a plurality of colors for constituting a full color pixel;
the plurality of colors are properties of a plurality of kinds of light whose wavelength varies in accordance with the plurality of colors;
the at least one diffraction grating comprises a plurality of diffraction gratings that respectively correspond to the plurality of kinds of light; and
the plurality of diffraction gratings change mutual intervals of the first plurality of protrusion strip parts depending on the wavelength of a corresponding one of the plurality of kinds of light.

13. A display device comprising:
a pixel electrode;
a light emitting element layer disposed on the pixel electrode;
a common electrode disposed on the light emitting element layer; and
a sealing layer disposed on the common electrode, wherein
the sealing layer comprises a first diffraction grating and a second diffraction grating that is located between the first diffraction grating and the common electrode,
the sealing layer comprises a first inorganic layer that is made of an inorganic material, a second inorganic layer that is made of an inorganic material and is located between the first inorganic layer and the common electrode, and an organic layer that is made of an organic material and is located between the first inorganic layer and the second inorganic layer,
the first diffraction grating is located on the organic layer,
the second diffraction grating is located on the second inorganic layer,
the organic layer comprises a first organic layer that is in contact with the first inorganic layer and a second organic layer that is in contact with the first organic layer and the second inorganic layer, and
the first diffraction grating is located on an interface between the first organic layer and the second organic layer.

\* \* \* \* \*